United States Patent [19]
Lee

[11] Patent Number: 5,913,133
[45] Date of Patent: Jun. 15, 1999

[54] METHOD OF FORMING ISOLATION LAYER FOR SEMICONDUCTOR DEVICE

[75] Inventor: Byung Seok Lee, Kyoungki-do, Rep. of Korea

[73] Assignee: Hyundai Electronics Industries Co., Ltd., Rep. of Korea

[21] Appl. No.: 08/992,642

[22] Filed: Dec. 17, 1997

[30] Foreign Application Priority Data

Dec. 20, 1996 [KR] Rep. of Korea ............... 96-69247

[51] Int. Cl.$^6$ .................................................. H01L 21/76
[52] U.S. Cl. .................. 438/444; 438/439; 438/297; 438/298
[58] Field of Search ................................. 438/439, 443, 438/444, 445, 297, 298

[56] References Cited

U.S. PATENT DOCUMENTS

| | | | |
|---|---|---|---|
| 5,173,444 | 12/1992 | Kawamura | 438/445 |
| 5,358,893 | 10/1994 | Yang et al. | 437/70 |
| 5,824,594 | 10/1998 | Kim et al. | 438/445 |
| 5,837,595 | 11/1998 | Ahn et al. | 438/443 |

*Primary Examiner*—Trung Dang
*Attorney, Agent, or Firm*—Blakely Sokoloff Taylor & Zafman

[57] ABSTRACT

An isolation layer forming method for a semiconductor device which prevents damage of an isolation layer due to a misalignment of a mask when a contact hole is formed. An anti-oxidative pattern for exposing an isolation region is formed on a semiconductor substrate, and an undercut portion on a lower sidewall of the anti-oxidative pattern is formed by selectively removing the exposed semiconductor substrate by an isotropic etching process. Thereafter, the isolation layer is formed by an oxidation process so that an edge portion of the isolation layer which is placed in the undercut portion is not exposed to a surface of the semiconductor substrate.

4 Claims, 8 Drawing Sheets

1

METHOD OF FORMING ISOLATION LAYER FOR SEMICONDUCTOR DEVICE

BACKGROUND OF THE INVENTION

1. Field of the Invention

The present invention relates to a method of forming an isolation layer in a semiconductor device manufacturing process. In particular, the present invention relates to an isolation layer forming method for a semiconductor device which can prevent an isolation layer from being etched due to the misalignment of a mask when a contact hole is formed, and thus prevent the surface of a semiconductor substrate from being exposed.

2. Description of the Related Art

With the high integration of a semiconductor device, the spaces between patterns in the semiconductor chip have been gradually narrowed. Accordingly, in a device such as a DRAM of more than 256 megabytes, a modified isolation layer forming process such as a recessed LOCOS (R-LOCOS) process has been used to secure an active region of the device. The R-LOCOS method has been widely used because it has advantages that a bird's beak is hardly generated and thus the active region is secured. However, according to the R-LOCOS method, the isolation layer is apt to be etched due to the limitations of a masking process or misalignment of a mask when a contact hold is formed through a following process. This causes the portion of the semiconductor substrate, from which the isolation layer is removed by etching, to be exposed, thereby resulting in the generation of a junction leakage.

FIGS. 1A to 1H are sectional views illustrating a conventional process of manufacturing a semiconductor device. Referring to FIGS. 1A to 1H, the conventional method of forming an isolation layer in a semiconductor device manufacturing process will be explained in detail.

First, as shown in FIG. 1A, a pad oxide film 12 and a nitride layer 13 are sequentially deposited on a silicon substrate 11, and then a photosensitive pattern 14 is formed on the deposited nitride layer 13.

Thereafter, as shown in FIG. 1B, the nitride layer 13 and the pad oxide film 12 are patterned by an anisotropical etching process using the photosensitive pattern 14 as an etch-blocking layer.

Thereafter, as shown in FIG. 1C, the photosensitive pattern 14 is removed, and then a rinsing process is performed. During the rinsing process, the pad oxide film 12 is partially etched, and an edge portion of the pad oxide film 12 is placed on the lower inside of the nitride layer pattern 13. Next, a nitride film 15 for forming a spacer is deposited on a resultant structure.

Thereafter, as shown in FIG. 1D, the whole upper surface of the nitride film 15 is etched, so that a nitride film spacer 15a is formed on a side wall of the pattern of the nitride layer 13 and the pad oxide film 12.

Thereafter, as shown in FIG. 1E, the portion of the silicon substrate 11 where an isolation layer is to be formed is selectively removed to a depth of about 500 Å by an anisotropic etching process. In FIG. 7E, the reference numeral "A" represents a profile of the portion of the silicon substrate 11 which is joined to the edge portion of the nitride film spacer 15a and which is effected by anisotropically etching the silicon substrate 11.

Thereafter, as shown in FIG. 1F, a field oxide layer 16 is formed on the isolation region by an oxidation process. At this time, the field oxide layer 16 is formed inside the silicon substrate 11 such that it has almost 90 degrees with respect to the surface of the silicon substrate 11.

Thereafter, as shown in FIG. 1G, the pattern of the nitride layer 13 and the nitride film spacer 15a are removed, and then a rinsing process is performed. Next, a transistor, a bit line, etc. (not illustrated), which include an impurity-doped region 17, are formed, an oxide layer is formed as an insulating layer 18, and then a photosensitive pattern 19 for forming a contact hole is formed.

Thereafter, as shown in FIG. 1H, the insulating layer 18 is selectively etched to form the contact hole using the photo- sensitive pattern 19 as an etch-blocking layer. At this time, the edge portion of the field oxide layer 16 is etched as shown as "B" in FIG. 1H due to the limitations of the masking process and the misalignment of the mask, causing the silicon substrate 11 to be exposed. As a result, the junction leakage is generated due to the exposure of the silicon substrate, thereby deteriorating the reliability of the device.

SUMMARY OF THE INVENTION

It is an object of the present invention to solve the problems involved in the related art, and to provide a method of forming an isolation layer for a high-integration semiconductor device which can prevent damage of the isolation layer due to the misalignment of the mask.

In order to achieve the above object, there is provided a method of forming an isolation layer for a semiconductor device, comprising the steps of forming an anti-oxidative pattern for exposing an isolation region on a semiconductor substrate, forming an undercut portion of a lower sidewall of the anti-oxidative pattern by selectively removing the exposed semiconductor substrate by an isotropic etching process, and forming the isolation layer by an oxidation process so that an edge portion of the isolation layer which is placed in the undercut portion is not exposed to a surface of the semiconductor substrate.

BRIEF DESCRIPTION OF THE DRAWINGS

The above object, other features and advantages of the present invention will become more apparent by describing the preferred embodiment thereof with reference to the accompanying drawings, in which.

DETAILED DESCRIPTION OF THE PREFERRED EMBODIMENT

Figure 1A:
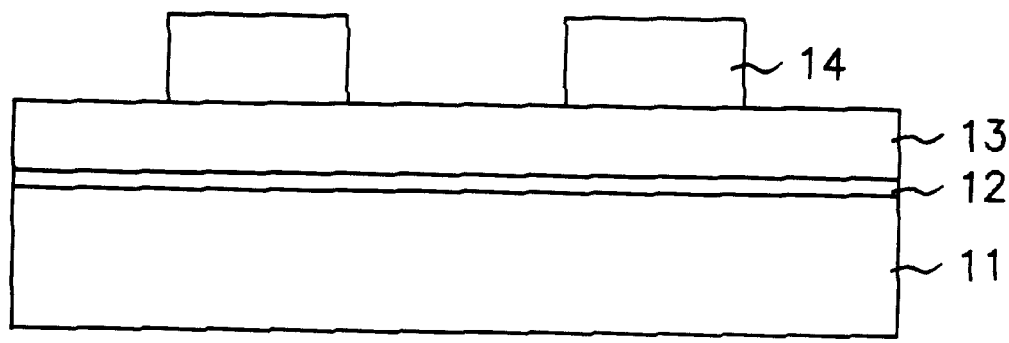
FIGS. 1A to 1H are sectional views illustrating a conventional process of manufacturing a semiconductor device.
Figure 1B:
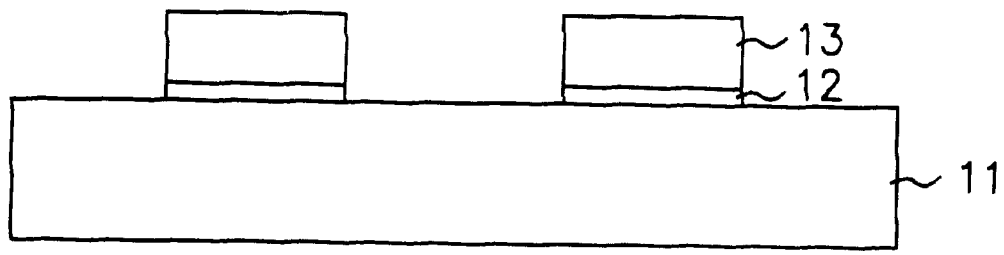
Figure 1C:
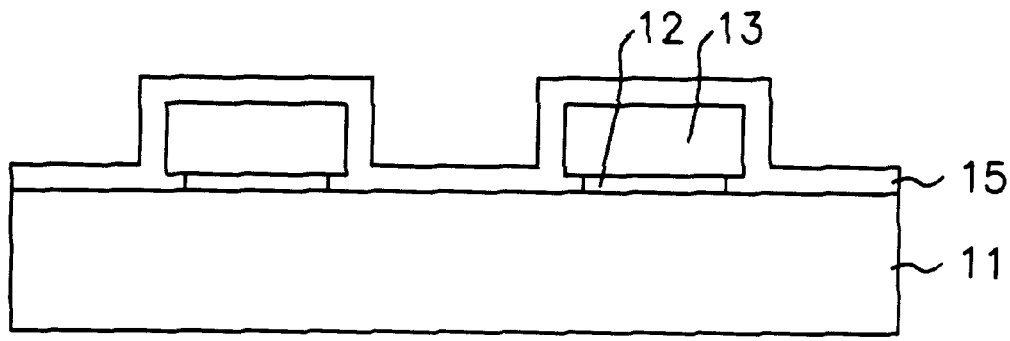
Figure 1D:
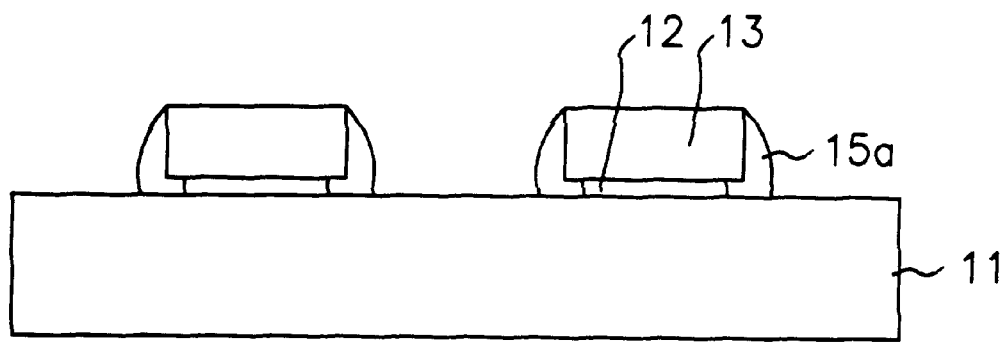
Figure 1E:
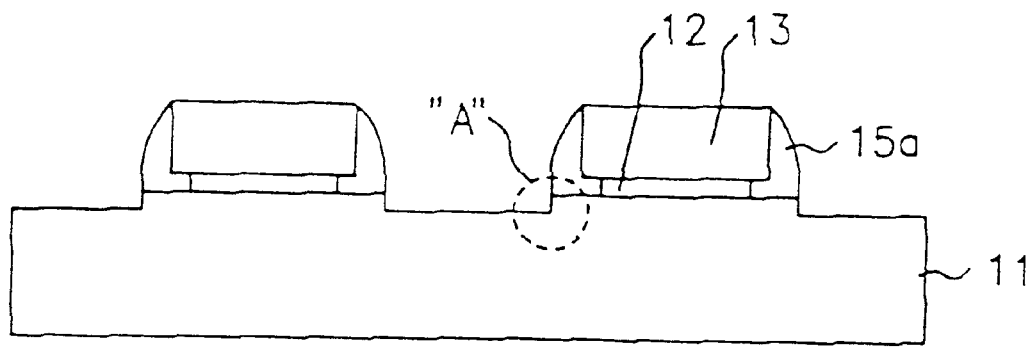
Figure 1F:
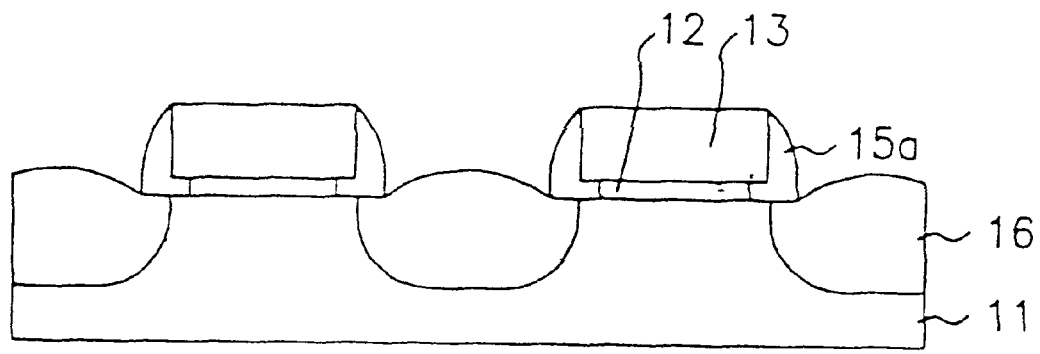
Figure 1G:
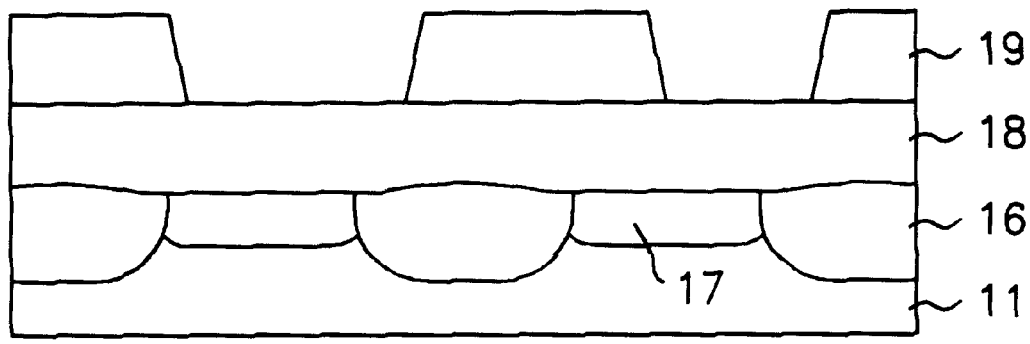
Figure 1H:
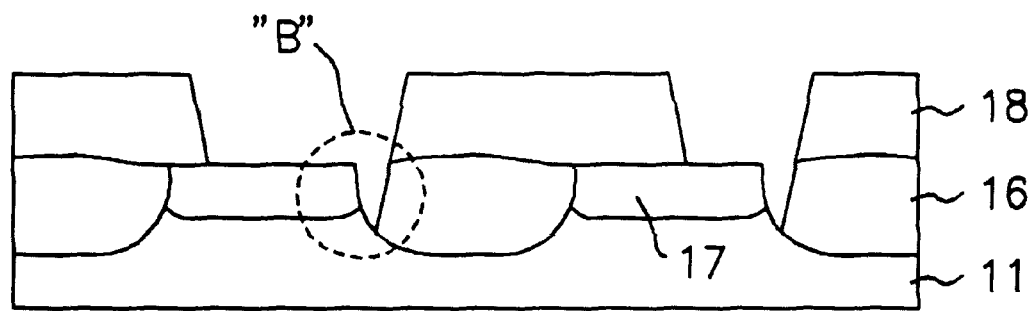
Figure 2A:
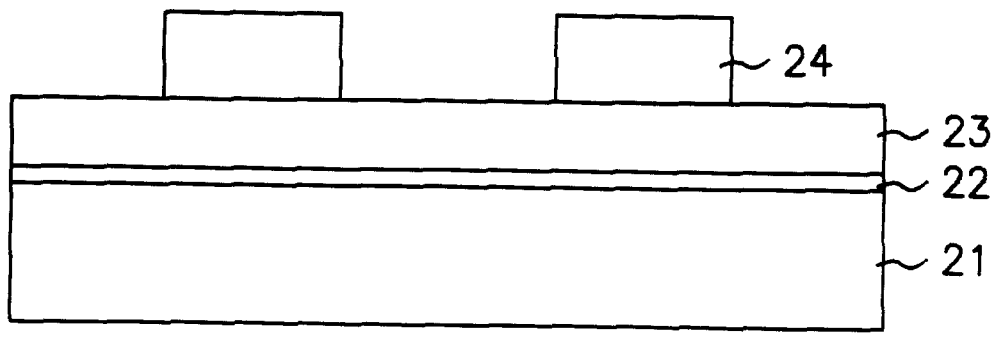
FIGS. 2A to 2H are sectional views illustrating the process of manufacturing a semiconductor device according to an embodiment of the present invention.

A preferred embodiment of the present invention will now be explained with reference to FIGS. 2A to 2H. The isolation layer forming method and the semiconductor device manufacturing method using the isolation layer forming method are explained as follows:

First, as shown in FIG. 2A, a pad oxide film 22 and a nitride layer 23 are deposited on a silicon substrate 21, and then a photosensitive pattern 24 for defining an isolation region is formed on the deposited nitride layer 23.

Figure 2B:
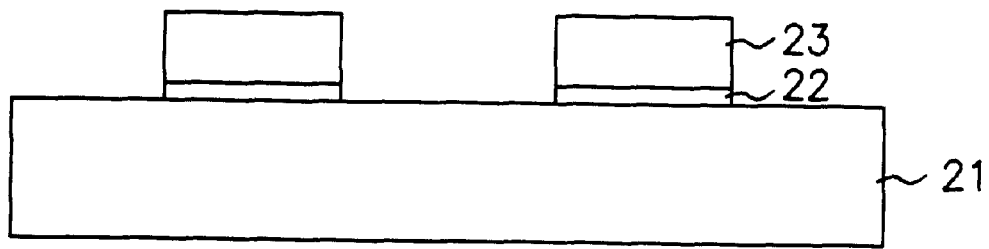

Thereafter, as shown in FIG. 2B, the nitride layer 23 and the pad oxide film 22 are patterned by an anisotropic etching process using the photosensitive pattern 24 as an etch-blocking layer.

Figure 2C:
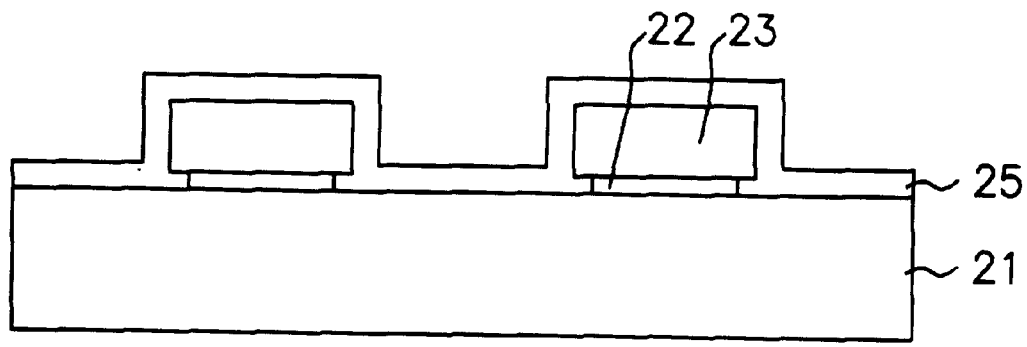

Thereafter, as shown in FIG. 2C, the photosensitive pattern 24 is removed, and then a rinsing process is performed. During the rinsing process, the pad oxide film 22 is partially etched, and an edge portion of the pad oxide film 22 is placed on the lower inside of the nitride layer pattern 23. Next, a nitride film 25 for forming a spacer is deposited on a resultant structure.

Figure 2D:
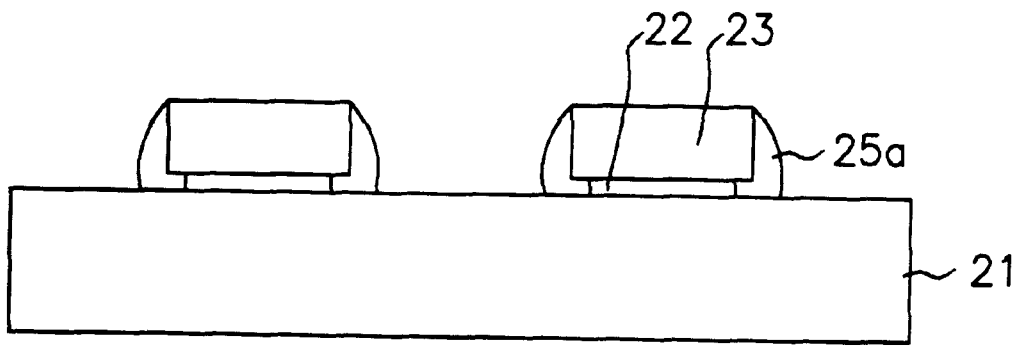

Thereafter, as shown in FIG. 2D, the whole upper surface of the nitride film 25 is etched, so that a nitride film spacer 25a is formed on a side wall of the pattern of the nitride layer 23 and the pad oxide film 22.

Figure 2E:
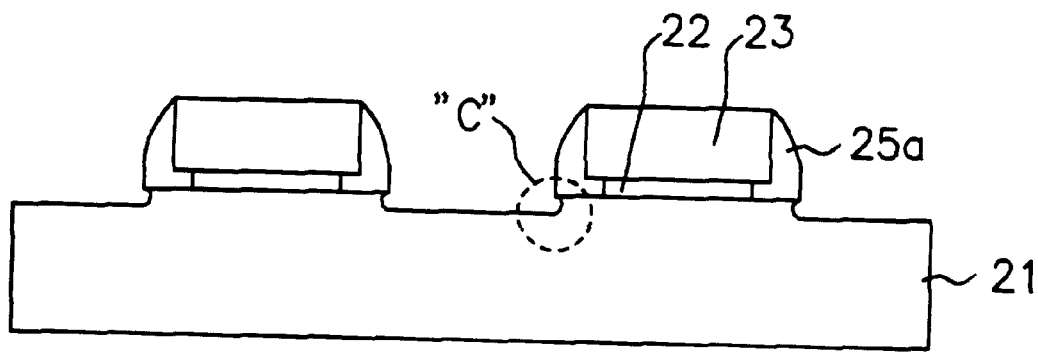

Thereafter, as shown in FIG. 2E, the silicon substrate 21 is continuously removed to a depth of about 500 Å by an isotropic etching process using an etching equipment for forming the nitride film spacer 25a. In FIG. 2E, the reference numeral "C" represents the undercut region formed on a portion of the silicon substrate 21 which is joined to the edge portion of the nitride film spacer 25a by the isotropic etching process.

In the embodiment, the etching process is performed using TCP (transmission coupled plasma) 9408 equipment manufactured by LRC with a top power of 200~800 W and a bottom power of 0~200 W, under pressure of 20~200 mTorr, and in ambience of $SF_6$ of 10~200 sccm, He of 20~200 sccm, and $O_2$ of 0~20 sccm.

Figure 2F:
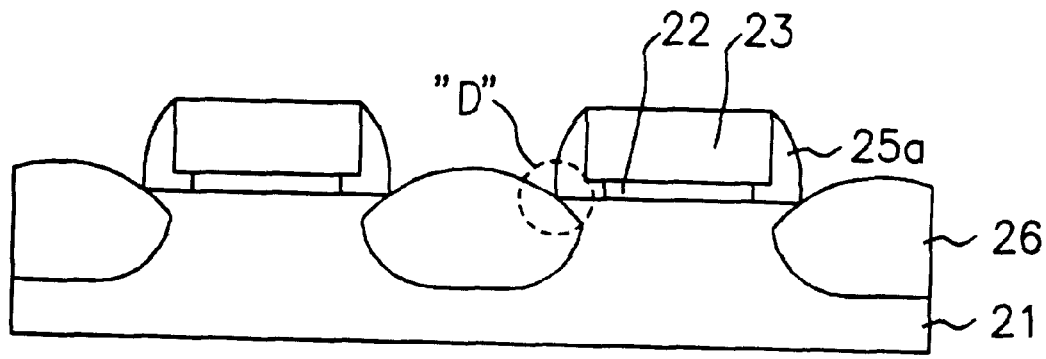

Thereafter, as shown in FIG. 2F, a field oxide layer 26 is formed by an oxidation process. At this time, the edge portion of the field oxide layer 26 is placed in the undercut region formed by the isotropic etching process, and thus it is not exposed to the surface of the silicon substrate. In FIG. 2F, the reference numeral "D" represents the edge portion of the field oxide layer 26 which is positioned in the undercut region formed on the portion of the silicon substrate 21 that is joined to the edge portion of the nitride film spacer 25a.

Figure 2G:
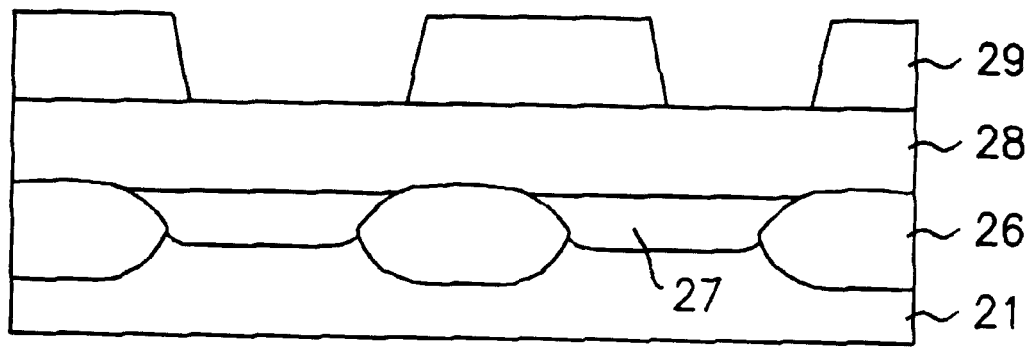

Thereafter, as shown in FIG. 2G, the pattern of the nitride layer 13 and the nitride film spacer 25a are removed, and then a rinsing process is performed, so that only the field oxide layer 26 remains on the silicon substrate 21. Next, a transistor, a bit line, etc. (not illustrated), which include an impurity-doped region 27, are formed, and then an oxide layer is formed as an insulating layer 28. Next, a photosensitive pattern 29 for forming a contact hole is formed on a predetermined region of the insulating layer.

Figure 2H:
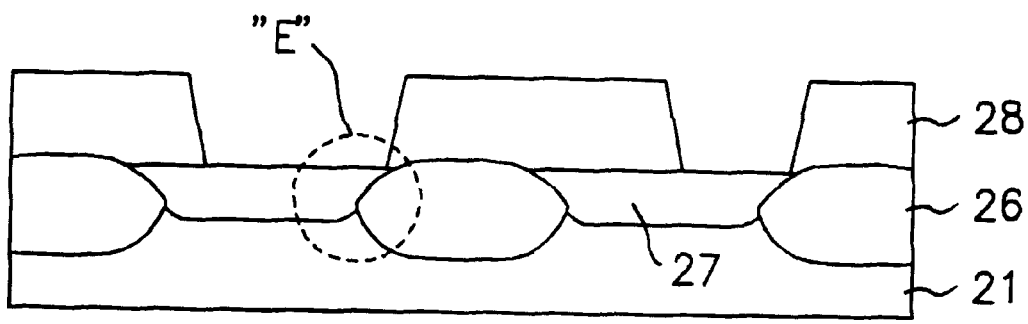

Thereafter, as shown in FIG. 2H, the contact hole is formed by selectively etching the oxide layer 28, and then the photosensitive pattern 29 is removed. At this time, since the edge portion of the field oxide layer 26 is not exposed to the surface of the silicon substrate as shown as "E" in FIG. 2H, the damage of the field oxide layer 26 can be prevented even though the misalignment of the mask occurs. As a result, the junction leakage due to the exposure of the silicon substrate is prevented from being generated.

As described above, according to the present invention, the damage of the isolation layer caused by the misalignment of the mask is prevented by forming the isolation layer so that the edge portion of the isolation layer is not exposed to the surface of the semiconductor substrate, and thus the junction leakage current is prevented from being increased, improving the reliability of the semiconductor device.

While the present invention has been described and illustrated herein with reference to the preferred embodiment thereof, it will be understood by those skilled in the art that various changes in form and details may be made therein without departing from the spirit and scope of the invention.

What is claimed is:

1. A method of forming an isolation layer for a semiconductor device, comprising the steps of:

forming an anti-oxidative pattern for exposing an isolation region on a semiconductor substrate;

forming an undercut portion on a lower sidewall of said anti-oxidative pattern by selectively removing said exposed semiconductor substrate by an isotropic etching process; and forming said isolation layer by an oxidation process so that an edge portion of said isolation layer which is placed in said undercut portion is not exposed to a surface of said semiconductor substrate.

2. A method of forming an isolation layer as claimed in claim 1, wherein the step of forming said anti-oxidative pattern comprises the substeps of:

forming consecutively a pad oxide film and a first nitride layer on said semiconductor substrate;

forming a pattern of said pad oxide film and said first nitride layer by selectively etching said laminated pad oxide film and first nitride layer;

forming a second nitride layer on a whole surface of said semiconductor substrate; and forming a second nitride film spacer by etching a whole upper surface of said second nitride layer by an anisotropic etching process.

3. A method of forming an isolation layer as claimed in claim 1, wherein said isotropic etching process for said semiconductor substrate comprises a plasma dry etching process.

4. A method of forming an isolation layer as claimed in claim 3, wherein said isotropic plasma dry etching process is performed using a TCP (transmission coupled plasma) type equipment with a top power of 200~800 W and a bottom power of 0~200 W, under pressure of 20~200 mTorr, and in ambience of $SF_6$ of 10~200 sccm, He of 20~200 sccm, and $0_2$ of 0~20 sccm.

* * * * *